(12) United States Patent
Tsuchiya et al.

(10) Patent No.: US 9,543,487 B2
(45) Date of Patent: Jan. 10, 2017

(54) LIGHT-EMITTING DEVICE AND METHOD OF MANUFACTURING THE SAME

(71) Applicant: TOYODA GOSEI CO., LTD., Kiyosu-shi (JP)

(72) Inventors: Yosuke Tsuchiya, Kiyosu (JP); Shota Shimonishi, Kiyosu (JP); Shigeo Takeda, Kiyosu (JP); Tomohiro Miwa, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 58 days.

(21) Appl. No.: 14/606,670

(22) Filed: Jan. 27, 2015

(65) Prior Publication Data

US 2015/0280088 A1    Oct. 1, 2015

(30) Foreign Application Priority Data

Mar. 26, 2014  (JP) .................................. 2014-063836

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01); *H01L 2224/48091* (2013.01); *H01L 2224/48137* (2013.01); *H01L 2924/181* (2013.01); *H01L 2933/0066* (2013.01)

(58) Field of Classification Search
CPC ................. H01L 33/62; H01L 25/0753; H01L 2224/48137; H01L 2224/48091; H01L 2924/181; H01L 2933/0066
See application file for complete search history.

(56) References Cited

U.S. PATENT DOCUMENTS

| | | | |
|---|---|---|---|
| 2005/0207165 A1 | 9/2005 | Shimizu et al. | |
| 2012/0319143 A1 | 12/2012 | Takei et al. | |
| 2013/0141891 A1* | 6/2013 | Funakubo | F21V 21/00 362/84 |
| 2013/0229794 A1* | 9/2013 | Miki | F21V 15/00 362/223 |
| 2013/0249407 A1 | 9/2013 | Kashiwagi et al. | |

FOREIGN PATENT DOCUMENTS

| | | |
|---|---|---|
| JP | 2003-124528 A | 4/2003 |
| JP | 2013-004739 A | 1/2013 |
| JP | 2013-118292 A | 6/2013 |
| JP | 2013-201355 A | 10/2013 |

* cited by examiner

*Primary Examiner* — Michelle Mandala
(74) *Attorney, Agent, or Firm* — McGinn IP Law Group, PLLc.

(57) ABSTRACT

A light-emitting device includes a first light-emitting element, a second light-emitting element, a third light-emitting element placed between the first and second light-emitting elements, and a bonding wire passing directly over the third light-emitting element and connecting the first light-emitting element with the second light-emitting element.

20 Claims, 3 Drawing Sheets

LIGHT-EMITTING DEVICE AND METHOD OF MANUFACTURING THE SAME

The present application is based on Japanese patent application No.2014-063836 filed on Mar. 26, 2014, the entire contents of which are incorporated herein by reference.

BACKGROUND OF THE INVENTION

1. Field of the Invention

The invention relates to a light-emitting device and a method of manufacturing the light-emitting device.

2. Description of the Related Art

A light-emitting device is known which has plural light-emitting elements connected to each other through a bonding wire (see e.g. JP-A-2013-118292).

SUMMARY OF THE INVENTION

In the light-emitting device disclosed in JP-A-2013-118292, if the space between the plural light-emitting elements decreases along with the downsizing of the light-emitting device, the length of the bonding wire also decreases. Thus, it is difficult to install the bonding wire and, furthermore, the bonding wire may be broken due to stress generated by the expansion of a sealing resin formed on the plural light-emitting elements.

It is an object of the invention to provide a light-emitting device that is constructed so as to allow the easy installation of the bonding wire and to prevent the breakage of the bonding wire even when the space between the plural light-emitting elements is narrowed, as well as a method of manufacturing the light-emitting device.

(1) According to one embodiment of the invention, a light-emitting device comprises:
  a first light-emitting element;
  a second light-emitting element;
  a third light-emitting element placed between the first and second light-emitting elements; and
  a bonding wire passing directly over the third light-emitting element and connecting the first light-emitting element with the second light-emitting element.

In the above embodiment (1) of the invention, the following modifications and changes can be made.

(i) A horizontal distance from the bonding wire to the center of a wire-bonding electrode on an upper surface of the third light-emitting element is not less than 1.75 times a diameter of the bonding wire.

(ii) The light-emitting device further comprises a sealing material for sealing the first, second and third light-emitting elements and the bonding wire.

(iii) At least one of a filler and a phosphor particle is dispersed into the sealing material.

(iv) The bonding wire comprises Ag.

(v) The first to the third light-emitting elements are aligned.

(2) According to another embodiment of the invention, a method of manufacturing a light-emitting device comprises connecting a first light-emitting element with a second light-emitting element through a bonding wire such that the bonding wire passes directly over a third light-emitting element placed between the first and second light-emitting elements.

In the above embodiment (2) of the invention, the following modifications and changes can be made.

(vi) The bonding wire is installed such that a horizontal direction from the bonding wire to the center of a wire-bonding electrode on an upper surface of the third light-emitting element is not less than 1.75 times a diameter of the bonding wire.

(vii) The method further comprises sealing the first, second and third light-emitting elements and the bonding wire with a sealing material.

(viii) At least one of a filler and phosphor particle is dispersed into the sealing material.

(ix) The bonding wire comprises Ag.

Effects of the Invention

According to one embodiment of the invention, a light-emitting device can be provided that is constructed so as to allow the easy installation of the bonding wire and to prevent the breakage of the bonding wire even when the space between the plural light-emitting elements is narrowed, as well as a method of manufacturing the light-emitting device.

BRIEF DESCRIPTION OF THE DRAWINGS

Next, the present invention will be explained in more detail in conjunction with appended drawings, wherein.

DESCRIPTION OF THE PREFERRED EMBODIMENT

Embodiment

Structure of Light-Emitting Device

Figure 1:
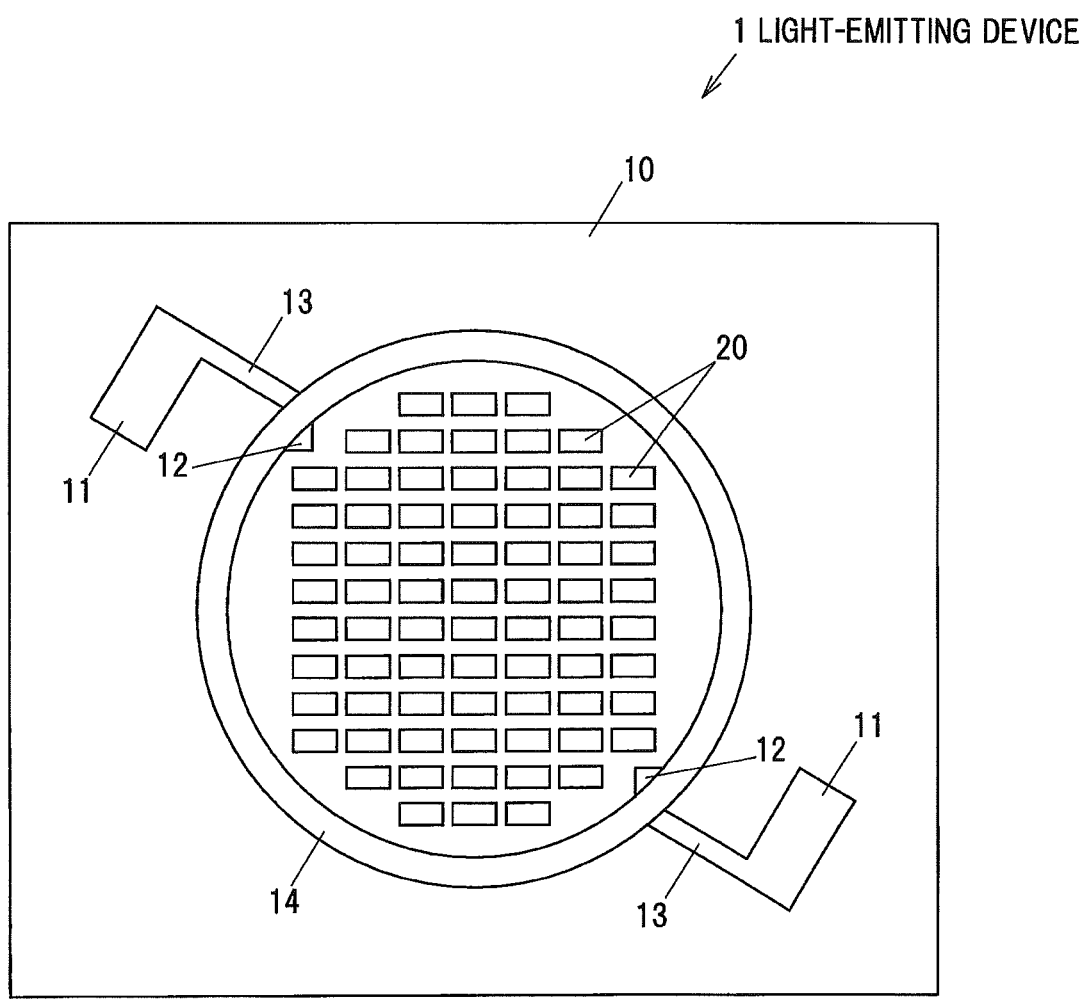
FIG. 1 is a top view showing a light-emitting device in an embodiment of the invention.
Figure 2:
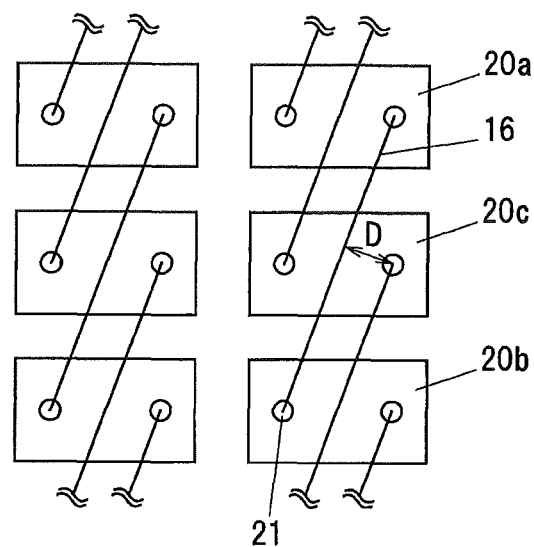
FIG. 2 is an enlarged top view showing a portion of an element-mounting region of the light-emitting device.

FIG. 1 is a top view showing a light-emitting device 1 in the embodiment. FIG. 2 is an enlarged top view showing a portion of an element-mounting region of the light-emitting device 1.

The light-emitting device 1 has a substrate 10, plural light-emitting elements 20 placed on the substrate 10, a dam 14 surrounding the light-emitting elements 20, and a sealing resin 15 filled in the dam 14 to seal the light-emitting elements 20. The light-emitting device 1 may not have the sealing resin 15. In FIGS. 1 and 2, illustration of the sealing resin 15 is omitted.

The substrate 10 is a substrate having wirings and is, e.g., a wiring substrate having a wiring pattern on a surface or a lead frame inserted board.

The light-emitting element 20 is a face-up type LED (Light Emitting Diode) or laser diode and has a chip substrate 22 and a crystal layer 23 formed thereon, as described later. A wire-bonding electrode 21 to which a bonding wire 16 is connected is formed on a surface of the crystal layer 23.

The chip substrate 22 is, e.g., a sapphire substrate. The crystal layer 23 is, e.g., a GaN-based semiconductor layer formed on the chip substrate 22 by epitaxial crystal growth and has a light-emitting layer sandwiched between an n-type semiconductor layer and a p-type semiconductor layer.

The light-emitting elements 20 are coupled by the bonding wires 16. The light-emitting elements 20 located at ends of the coupled elements are connected to wire-bonding terminals 12 by the bonding wires 16.

In the configuration shown in FIG. 1, each wire-bonding terminal 12 is connected to an external connection terminal 11 via a wiring electrode 13 and receives power supply from the outside through the external connection terminal 11.

As shown in FIG. 2, the light-emitting device 1 has a light-emitting element 20a, a light-emitting element 20b, a light-emitting element 20c placed between the light-emitting elements 20a and 20b, and a bonding wire 16 which passes directly over the light-emitting element 20c to connect the light-emitting element 20a to the light-emitting element 20b. The light-emitting elements 20a, 20b and 20c are included in the light-emitting elements 20.

In case of connection between the light-emitting element 20a and the light-emitting element 20b which are arranged with the light-emitting element 20c interposed therebetween, the bonding wire 16 can be longer than for the connection between adjacent light-emitting elements, e.g., between the light-emitting elements 20a and 20c. By this configuration, it is possible to easily form the bonding wire 16, and wire breakage due to stress generated by expansion of the sealing resin 15, which occurs when the bonding wire 16 is too short, can be also prevented.

A horizontal distance D from the bonding wire 16 connecting between the light-emitting elements 20a and 20b to the center of the wire-bonding electrode 21 on the upper surface of the light-emitting element 20c is preferably equal to or more than 1.75 times the diameter of the bonding wire 16.

This is because it is possible to prevent contact of a ball bonding capillary with the bonding wire 16 connecting between the light-emitting elements 20a and 20b when subsequently connecting another bonding wire 16 to the wire-bonding electrode 21 of the light-emitting element 20c. As a result, breakage of the bonding wire 16 due to contact with the capillary can be prevented.

In general, an outer diameter of a tip of a capillary is about 1.5 to 3.5 times a diameter of a bonding wire to be connected. Thus, it is possible to prevent contact of the capillary with the bonding wire 16 connecting between the light-emitting elements 20a and 20b by setting the minimum value of the horizontal distance D to 1.75 times the outer diameter of the bonding wire 16 which is half of 3.5 times, i.e., half of the maximum outer diameter of the tip of the capillary.

As a material of the bonding wire 16, it is possible to use, e.g., Ag or Au. It is particularly preferable to use Ag which is excellent in electrical conductivity and light reflectance. In general, bonding wires formed of Ag are more likely to be broken than those formed of Au. In the present embodiment, however, the breakage of the bonding wire 16 can be prevented as described above and this allows Ag to be used as a material of the bonding wire 16.

The dam 14 is formed of, e.g., a resin such as silicone-based resin or epoxy-based resin containing white pigment such as titanium oxide.

The sealing resin 15 is formed of, e.g., a transparent resin such as a silicone-based resin or an epoxy-based resin. The sealing resin 15 may additionally contain a filler formed of $SiO_2$, etc., for scattering light or phosphor particle. When, for example, the emission color of the light-emitting element 20 is blue and the fluorescent color of the phosphor particles contained in the sealing resin 15 is yellow, the emission color of the light-emitting device 1 is white.

In the light-emitting device 1, the layout, shape, size and number of the light-emitting elements 20 and a connection pattern thereof by the bonding wires 16, etc., are not limited to those shown in FIGS. 1 and 2 as long as the light-emitting device 1 has a structure in which the bonding wire 16 connecting two light-emitting elements 20 passes directly over another light-emitting element 20 sandwiched between such two light-emitting elements 20.

Figure 3:
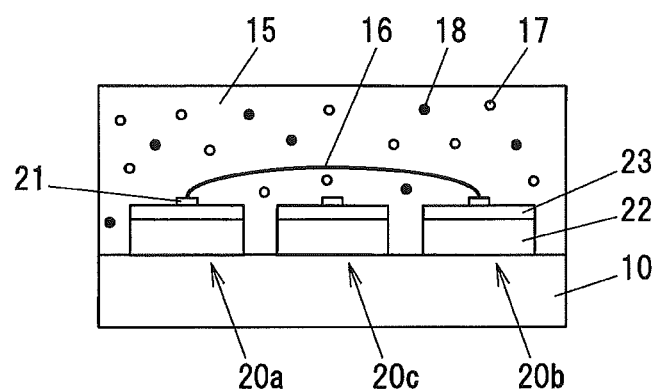
FIG. 3 illustrates a wire arrangement in which a bonding wire connecting between light-emitting elements passes directly over another light-emitting element.

FIG. 3 illustrates a wire arrangement in which the bonding wire 16 connecting between the light-emitting elements 20 passes directly over another light-emitting element 20. Among the bonding wires 16 used in the light-emitting device 1, only the bonding wire 16 connecting between the light-emitting elements 20a and 20b is shown in FIG. 3.

When the sealing resin 15 is formed as shown in FIG. 3, the larger the volume of the sealing resin 15 above and under the bonding wire 16, the larger the expansion of the sealing resin 15 and the more likely it is that the bonding wire 16 is broken.

In a light-emitting device having a conventional structure, a sealing resin is naturally present under a bonding wire connecting light-emitting elements and has a thickness from an upper surface of a substrate to the bonding wire.

On the other hand, in the present embodiment, the sealing resin 15 present under the bonding wire 16 passing directly over the light-emitting element 20a only has a thickness from the upper surface of the light-emitting element 20a to the bonding wire 16 as shown in FIG. 3, and the volume of the sealing resin under the bonding wire is smaller than the conventional structure.

Therefore, in the present embodiment, the degree of expansion can be reduced when the sealing resin 15 expands and this allows breakage of the bonding wire 16 to be prevented.

Furthermore, it is preferable that at least one of a filler 17 and phosphor particle 18 be dispersed into the sealing resin 15. The filler 17 and the phosphor particle 18 formed of an inorganic material have smaller thermal expansion coefficient than a resin constituting the sealing resin 15. Therefore, it is possible to decrease average thermal expansion of the entire sealing resin 15 by dispersing the filler 17 and the phosphor particle 18.

Effects of the Embodiment

In the embodiment, each bonding wire connecting between light-emitting elements is formed to pass directly over another light-emitting element, thereby allowing bonding wire breakage to be prevented.

Although the embodiment of the invention has been described above, the invention is not intended to be limited to the embodiment and the various kinds of modifications can be implemented without departing from the gist of the invention.

In addition, the invention according to claims is not to be limited to the embodiment. Further, all combinations of the features described in the embodiment are not necessary to solve the problem of the invention.

What is claimed is:

1. A light-emitting device, comprising:
   a first light-emitting element;
   a second light-emitting element;
   a third light-emitting element placed between the first and second light-emitting elements; and
   a bonding wire passing directly over the third light-emitting element and connecting the first light-emitting element with the second light-emitting element.

2. The light-emitting device according to claim 1, wherein a horizontal distance from the bonding wire to the center of a wire-bonding electrode on an upper surface of the third light-emitting element is not less than 1.75 times a diameter of the bonding wire.

3. The light-emitting device according to claim 1, further comprising a sealing material for sealing the first, second and third light-emitting elements and the bonding wire.

4. The light-emitting device according to claim 1, wherein at least one of a filler and a phosphor particle is dispersed into the sealing material.

5. The light-emitting device according to claim 1, wherein the bonding wire comprises Ag.

6. A method of manufacturing a light-emitting device, comprising connecting a first light-emitting element with a second light-emitting element through a bonding wire such that the bonding wire passes directly over a third light-emitting element placed between the first and second light-emitting elements.

7. The method according to claim 6, wherein the bonding wire is installed such that a horizontal direction from the bonding wire to the center of a wire-bonding electrode on an upper surface of the third light-emitting element is not less than 1.75 times a diameter of the bonding wire.

8. The method according to claim 6, further comprising sealing the first, second and third light-emitting elements and the bonding wire with a sealing material.

9. The method according to claim 6, wherein at least one of a filler and phosphor particle is dispersed into the sealing material.

10. The method according to claim 6, wherein the bonding wire comprises Ag.

11. A light-emitting device, comprising:
a first light-emitting element;
a second light-emitting element;
a third light-emitting element placed between the first and second light-emitting elements; and
a bonding wire passing directly over the third light-emitting element and connecting the first light-emitting element with the second light-emitting element, and
wherein the first to the third light-emitting elements are aligned.

12. The light-emitting device according to claim 1, wherein the bonding wire covers a portion of the third light-emitting element.

13. The light-emitting device according to claim 1, wherein the third light-emitting element is disposed underneath the bonding wire without contacting the third light-emitting element.

14. The light-emitting device according to claim 1, wherein the bonding wire is stacked on a top of a resin contacting the third light-emitting element.

15. The light-emitting device according to claim 1, wherein, in a top view, the bonding wire intersects with an edge of the third light-emitting element.

16. The light-emitting device according to claim 1, wherein a resin is interposed between the bonding wire and the third light-emitting element in a region directly above the third light-emitting element.

17. The light-emitting device according to claim 1, wherein the bonding wire is disposed at a center of the third light-emitting element.

18. The light-emitting device according to claim 1, further comprising a resin covering the first light-emitting element, the second light-emitting element, and the third light-emitting element.

19. The light-emitting device according to claim 18, wherein a first thickness of the resin between the bonding wire and the third light-emitting element is less than a second thickness of the resin between the bonding wire.

20. The light-emitting device according to claim 1, wherein an edge of each of the first light-emitting element, the second light-emitting element, and the third light-emitting element is parallel to one another.

* * * * *